US010054471B2

(12) United States Patent
Paci et al.

(10) Patent No.: US 10,054,471 B2
(45) Date of Patent: Aug. 21, 2018

(54) SENSOR DEVICE WITH INTEGRATED CALIBRATION SYSTEM AND CALIBRATION METHOD

(71) Applicant: STMICROELECTRONICS S.R.L., Agrate Brianza (IT)

(72) Inventors: Dario Paci, Sedriano (IT); Francesco Procopio, Sedriano (IT); Carlo Valzasina, Gessate (IT); Paolo Angelini, Bologna (IT); Francesco Diazzi, Milan (IT); Roberto Pio Baorda, Milan (IT); Danilo Karim Kaddouri, Pero (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 841 days.

(21) Appl. No.: 14/498,966

(22) Filed: Sep. 26, 2014

(65) Prior Publication Data
US 2015/0082856 A1 Mar. 26, 2015

(30) Foreign Application Priority Data
Sep. 26, 2013 (IT) .............................. TO2013A0775

(51) Int. Cl.
G01N 25/18 (2006.01)
G01D 18/00 (2006.01)
(Continued)

(52) U.S. Cl.
CPC ........... *G01D 18/00* (2013.01); *B81C 99/003* (2013.01); *G01K 13/00* (2013.01);
(Continued)

(58) Field of Classification Search
CPC combination set(s) only.
See application file for complete search history.

(56) References Cited

U.S. PATENT DOCUMENTS

| 5,247,278 A | 9/1993 | Pant et al. | |
|---|---|---|---|
| 2010/0050747 A1* | 3/2010 | Hua | G01M 3/002 73/40 |

(Continued)

OTHER PUBLICATIONS

Jansen et al., "A CMOS-compatible 24MHz poly-SiGe MEMS oscillator with low-power heating for frequency stabilization over temperature," Joint Conference of the IEEE International Frequency Control and the European Frequency and Time Forum (FCS), San Francisco, CA, May 2-5, 2011, pp. 1-5.

(Continued)

*Primary Examiner* — Lisa Caputo
*Assistant Examiner* — Nasir U Ahmed
(74) *Attorney, Agent, or Firm* — Seed Intellectual Property Law Group LLP

(57) ABSTRACT

An integrated sensor device including a first die, housing a sensor element to detect a quantity external to the sensor device and transduce the external quantity into an electrical sensing signal; a second die mechanically coupled to the first die so that the first and second dies are stacked on one another along one and the same axis; and at least one heater of a resistive type integrated in the first die and/or in the second die, having a first conduction terminal and a second conduction terminal configured to couple respective first and second conduction terminals of a signal generator for causing an electric current to flow, in use, between the first and second conduction terminals of the heater and generate heat by the Joule effect. It is possible to carry out calibration in temperature of the sensor element.

21 Claims, 7 Drawing Sheets

(51) Int. Cl.
  G01K 13/00  (2006.01)
  H05B 3/16  (2006.01)
  B81C 99/00  (2010.01)
  G01R 33/00  (2006.01)
  G01R 33/09  (2006.01)

(52) U.S. Cl.
  CPC ......... G01R 33/0017 (2013.01); G01R 33/09 (2013.01); H05B 3/16 (2013.01); B81B 2207/012 (2013.01); B81B 2207/03 (2013.01)

(56) References Cited

U.S. PATENT DOCUMENTS

| | | | |
|---|---|---|---|
| 2012/0161756 A1 | 6/2012 | Paci et al. | |
| 2013/0049903 A1* | 2/2013 | Liu | ........................ G02B 1/002 333/219 |

OTHER PUBLICATIONS

Salvia et al., "Real-Time Temperature Compensation of MEMS Oscillators Using an Integrated Micro-Oven and a Phase-Locked Loop," *Journal of Microelectromechanical Systems* 19(1):192-201, Feb. 2010.

* cited by examiner

SENSOR DEVICE WITH INTEGRATED CALIBRATION SYSTEM AND CALIBRATION METHOD

BACKGROUND

Technical Field

The present disclosure relates to a sensor device with integrated calibration system, and to a calibration method thereof.

Description of the Related Art

Up to now, sensor devices (in particular, ones manufactured using MEMS technology) are used in a wide range of applications in which the measurements supplied by the sensor have high accuracy. There are consequently sensors having a stable behavior in a wide range of temperatures, both as regards the sensitivity of the sensor and as regards the drifts in temperature of the signal supplied by the sensor itself.

Optimization of the design and of the steps of production of the sensor does not enable the aforementioned features for being met. To overcome this problem, according to the prior art, it is known to proceed with a step of calibration of the sensor as the temperature varies for compensating for the drifts that the output signal undergoes as the temperature of use varies. The step of calibration in temperature of the sensor comprises placing the sensor in an oven, bringing the sensor to one or more desired temperatures, and carrying out calibration.

It is evident that said calibration method takes a lot of time, with consequent increase in production costs.

BRIEF SUMMARY

An embodiment of the present disclosure is directed to an integrated sensor device that includes a first die that includes a sensor element configured to detect a quantity external to the sensor device and transduce said external quantity into an electrical sensing signal and a second die mechanically coupled to the first die, the first and second dies stacked on one another along a first axis. The integrated sensor device includes a resistive heater, having a first conduction terminal and a second conduction terminal, a signal generator having a first conduction terminal and a second conduction terminal electrically coupled to the first and second conduction terminals of the resistive heater and configured to provide an electric current between the first and second conduction terminals of the resistive heater to generate heat by the Joule effect to bring the sensor element to a predefined temperature, and a calibration circuit configured to acquire said electrical sensing signal when the sensor element has reached said predefined temperature and to obtain an offset value that biases the electrical sensing signal when the sensor element has reached said predefined temperature.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
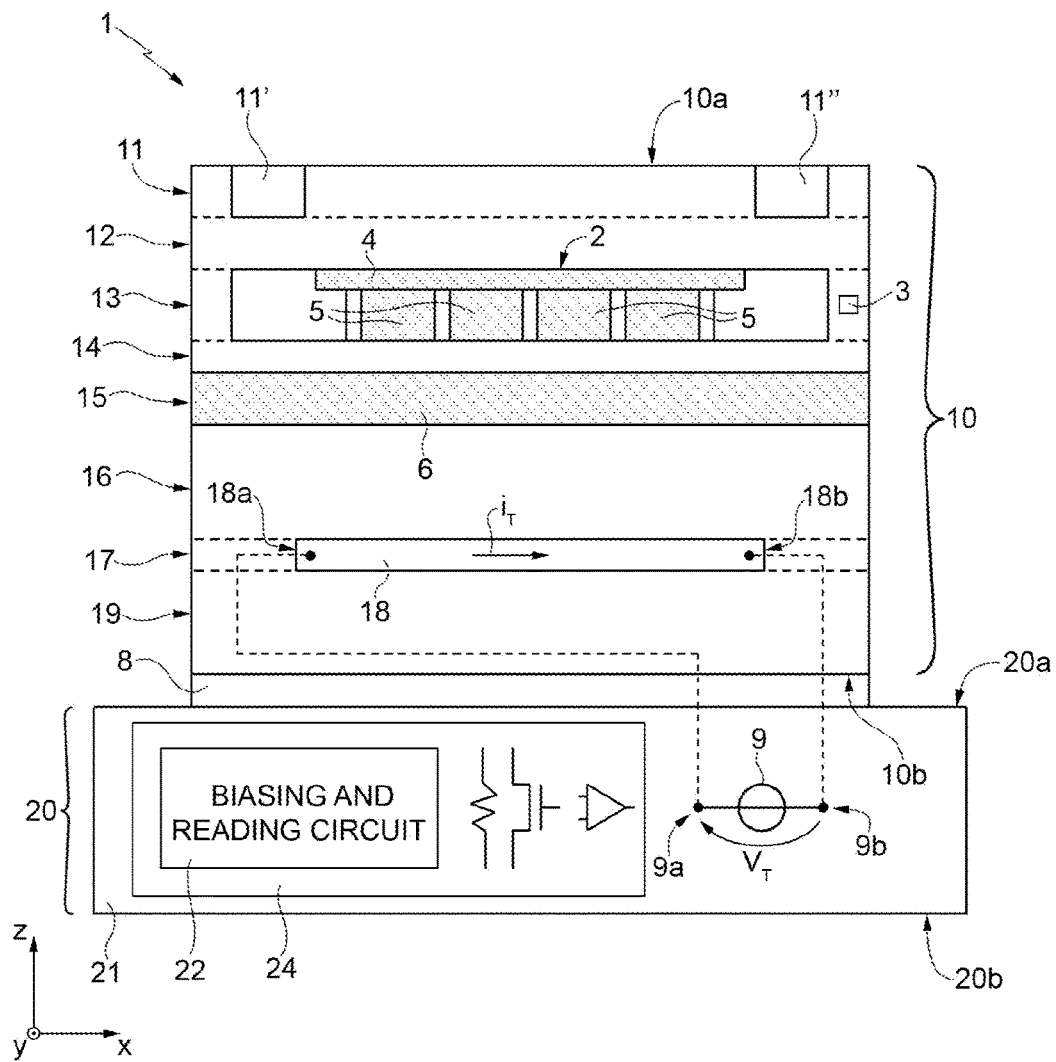
FIGS. 1-5B show respective embodiments of the sensor device with an integrated resistive heater that can be operated for calibration of the sensor device.

An integrated device, in particular manufactured using MEMS technology, generally comprises a first body (usually defined as "die") including semiconductor material (in particular silicon), integrating a micromechanical structure, operating, for example, as sensor for one or more quantities for being detected and generating an electrical quantity that is a function of the quantity for being detected itself (for example, a capacitive variation, a variation of electrical resistance, etc.). In a known way, the die is the result of an operation of sawing or singulation of a wafer in which a plurality of elementary devices are simultaneously provided, during the manufacturing process.

The integrated device typically further comprises at least one second die including semiconductor material (in particular silicon), integrating at least one electronic component or circuit, designed for being electrically coupled to the micromechanical structure for co-operating functionally therewith. Typically, the second die integrates an ASIC (Application-Specific Integrated Circuit), electrically coupled to the micromechanical structure, having, for example, the function of circuit for reading the electrical quantity detected by the micromechanical structure, in the case where the latter operates as sensor (for example, to carry out operations of amplification and filtering of the electrical quantity detected itself). The ASIC may moreover have further functions of processing and evaluation of the quantities detected, for providing more or less complex integrated systems, so-called SiPs ("Systems-in-Package").

According to one aspect of the present disclosure, a sensor device is provided including:
  a first die, housing a sensor designed to detect a quantity external to the sensor device and transduce said external quantity into an electrical sensing signal;
  a second die, mechanically coupled to the first die; and
  at least one resistive heater, integrated in the first die and/or in the second die, having a first conduction terminal and a second conduction terminal configured for being coupled to respective first and second conduction terminals of a signal generator for causing a current to flow between the first and second conduction terminals and generate heat by the Joule effect.

The heater is, according to respective embodiments, a metal strip. Said metal strip is formed by means of known techniques of deposition of metal material and etching thereof to obtain the desired shape of the heater. As an alternative to the metal material, it is likewise possible to deposit and etch (e.g., photolithographically) doped polysilicon, or else provide implanted regions.

According to one embodiment, the second die is a die housing an integrated circuit operatively coupled to the sensor and configured for acquiring said electrical sensing signal (e.g., an ASIC).

According to a further embodiment, the second die is a substrate of a package designed to encapsulate and protect the first die. According to this embodiment a further third die is present, housing an integrated circuit operatively coupled to the sensor and configured for acquiring said electrical sensing signal (e.g., an ASIC). The third die is likewise designed to function as mechanical coupling interface between the first die (sensor die) and the second die (package die). Alternatively, both the first and third dies are mechanically coupled directly to the second die.

According to a further embodiment, the heater comprises a plurality of heatable sub-elements, formed both in the ASIC die and in the sensor die for guaranteeing a uniform heating of both of the dies.

According to further embodiments, the heater may be formed in an integrated way both in the substrate of the package and in the first die, or else in the substrate of the package and in the second die, or else again in the substrate of the package, in the first die, and in the second die.

There may moreover be provided other resistive heaters, different from the conductive strip, for example, MOSFETs appropriately designed to guarantee generation of a desired temperature, or transistors of some other type.

Thanks to the small dimensions of resistive heaters that may be obtained with micromachining techniques and thanks to the high freedom of design (said resistors may be integrated in positions corresponding to the sensitive elements of the sensor for guaranteeing an adequate heating thereof), the heating process is particularly fast and enables high uniformity of temperature for being obtained.

Furthermore, the possibility of integrating the heater in the package die and/or in the ASIC die and/or in the sensor die enables application of the present disclosure to a wide range of situations and fields of application, for example, also in the case where the sensor die and the ASIC die are coupled together by means of a thermally insulating interface (e.g., glue).

A further advantage of the present disclosure regards the possibility of calibrating the sensor not only in the testing stage at the end of the manufacturing process, but also during the service life of the sensor device.

The present disclosure will now be described with reference to two preferred contexts of application, magnetic sensors and inertial sensors (it being, however, possible for the disclosure being extended, in a way evident for a person skilled in the art, to other types of sensors such as, for example, pressure sensors).

FIG. 1 shows a cross-sectional view of a portion of a magnetic-field sensing device 1, comprising a first die 10, including semiconductor material and housing a magnetic-field sensing element 2, and a second die 20, including semiconductor material and housing a circuit 22 for biasing and reading the magnetic-field sensing element 2.

In particular, the first die 10 has a first main surface (front surface or top surface) 10a, lying in a horizontal plane XY, and a second main surface (rear surface) 10b, opposite to the top surface 10a along a vertical axis parallel to the direction Z, transverse to the horizontal plane XY.

In greater detail, the first die 10 comprises a layer 11, for interface towards the outside, for example, obtained by means of passivation techniques, which forms the top surface 10a. The passivation layer 11 (which is, for example, made of silicon oxide with a thickness of some micrometers) is designed to house conductive connections 11' and 11" (for example, metal conductive pads).

Extending underneath the passivation layer 11 is an insulation layer 12. The insulation layer 12 is made of dielectric material (e.g., silicon oxide) and houses a plurality of vias (not illustrated). Extending underneath the insulation layer 12 is a layer 13 comprising oxides and metals, housing conductive connections (for example, the connections that connect the bias-and-read circuit 22 to conduction terminals of the magnetic-field sensing element 2). According to this embodiment, the sensor device is based upon magnetoresistive elements, of an AMR type, and the magnetic-field sensing element 2 is a strip of magnetoresistive material. The aforementioned conductive connections are consequently electrically coupled to respective terminal portions of the strip of magnetoresistive material for biasing it in a way in itself known.

The magnetic-field sensing element 2 (here a magnetoresistive element) comprises a portion of ferromagnetic material 4 (typically a portion of an Ni/Fe alloy, with a thickness of some tens of nanometers) and a barber-pole structure 5 (made, for example, of copper, with a thickness of some hundreds of nanometers). The portion of ferromagnetic material 4 and the barber-pole structure 5 are in ohmic contact with one another. The patent and publication Nos. U.S. Pat. No. 5,247,278 and US 2012/0161756 describe respective embodiments of AMR sensors provided with magnetoresistive elements with barber-pole structure.

Extending underneath the layer 13 is a second insulation layer 14, made of dielectric material, which houses one or more conductive vias (not illustrated in the figure).

Then, extending underneath the second insulation layer 14 is a metal layer 15, which houses a magnetic-field generator 6. The magnetic-field generator 6 has, for example, a thickness comprised between some hundreds of nanometers and some micrometers and is used for the operations of set, reset, and/or offset compensation of the magnetic-field sensing element 2, in a known way.

The metal layer 15 may moreover house further connection elements and/or metal paths, to form connections between the top layers and the bottom layers.

Underneath the second metal layer there may be present one or more further insulation layers (designated as a whole by the reference number 16) and one or more heating layers (just one heating layer 17 is illustrated in FIG. 1) housing respective one or more resistive heaters 18 according to one embodiment of the present disclosure. The one or more resistive heaters 18 extend vertically aligned (i.e., aligned in the direction Z) to the magnetic-field sensing element 2. The heater 18 illustrated in FIG. 1 has, in cross-sectional view, an elongated shape having a principal axis of extension in the direction X, and includes a first conduction terminal 18a and a second conduction terminal 18b, which can be electrically coupled to a signal generator 9, for example, a voltage or current generator.

The signal generator 9 is typically formed in a die different from the first die 10, in particular in the second die 20, electrically coupled to the first die 10. According to a further embodiment, the signal generator 9 may be external to the sensor device 1; for example, it may form part of an integrated-circuit board on which the sensor device 1 is mounted. Irrespective of the particular embodiment, it is evident that the electrical coupling between the first and second conduction terminals 18a, 18b and the signal generator 9 may be obtained in a plurality of ways in themselves known, for example, by means of conductive wires, solder balls, etc.

For example, the electrical coupling between the first and second conduction terminals 18a, 18b and the signal generator 9 is provided by means of conductive through vias (not illustrated in detail), which extend starting from the heating layer 17 until they reach the passivation layer 11, traversing the intermediate layers. Said conductive through vias are electrically coupled to respective conductive pads (e.g., the conductive pads 11', 11", or other conductive pads housed in the passivation layer 11 and coplanar to the conductive pads 11', 11") which are in turn electrically coupled, for example, by means of conductive wires (wire bonding), to further conductive pads not belonging to the first die 10 but electrically coupled or couplable to respective conduction terminals 9a, 9b of the signal generator 9.

According to an alternative embodiment, the electrical coupling between the first and second conduction terminals 18a, 18b and the signal generator 9 is provided by means of conductive through vias (not illustrated in detail), which extend in the first die 10 starting from the heating layer 17 as far as the bottom surface 10b of the first die 10. In this case, electrical coupling with the signal generator 9 is obtained, for example, by means of solder balls formed at the bottom surface 10b of the first die 10 and designed for being coupled to conductive pads in turn electrically coupled to respective conduction terminals 9a, 9b of the signal generator 9.

According to one aspect of the present disclosure, the heater 18 comprises, one or more strips of metal material, for example, between five and ten, each having a thickness (measured in the direction Z) comprised between 0.5 μm and 3 μm, an extension in the direction X comprised between 50 μm and 500 μm, and an extension in the direction Y comprised between μm and 50 μm. The heater 18 generates heat by the Joule effect when it is traversed by an electric current.

It is evident that other shapes, dimensions, and materials may be chosen to obtain the resistive heater 18, as is illustrated in greater detail hereinafter.

According to a different embodiment, the heater 18 is an implanted region, obtained via steps of implantation and diffusion of dopant species during the steps of production of the first die 10. For example, said implanted region extends in the first die 10 to form one or more implanted strips each having a thickness (measured in the direction Z) comprised between 0.5 μm and 2 μm, an extension in the direction X comprised between 5 μm and 100 μm, and an extension in the direction Y comprised between 2 μm and 30 μm. In this case, the implanted region has a density of dopant atoms introduced comprised between $10^{15}$ and $10^{19}$.

According to a further embodiment, the heater 18 comprises one or more strips of doped polysilicon, each having a thickness (measured in the direction Z) comprised between 0.2 μm and 1 μm, an extension in the direction X comprised between 5 μm and 100 μm, and an extension in the direction Y comprised between 2 μm and 30 μm.

Once again with reference to FIG. 1, the first die 10 moreover includes a substrate 19 extending underneath the heating layer 17. The bottom surface of the substrate 19 (designated by the reference number 10b) forms a coupling interface with the second die 20.

According to the embodiment illustrated in FIG. 1, the mechanical coupling between the first and second dies 10, 20 is guaranteed by the presence of a coupling layer 8, for example, a conductive glue or insulating glue. It is here pointed out that, in the case of an inertial sensor, a conductive glue is preferable in so far as it enables a better thermal conductivity for favoring uniformity of the temperature between the various elements.

Alternatively, as has been said, the coupling layer 8 includes, in a way not illustrated in detail, a plurality of solder balls, where coupling between the first and second dies 10, 20 is obtained using the flip-chip technique.

Other mechanical couplings between the first and second dies 10, 20 are in any case possible.

Furthermore, the first die integrates a temperature sensor 3, preferably housed in the proximity of the magnetic-field sensing element 2 in order to detect an effective temperature of the first die 10. The temperature sensor is a transducer of a known type that generates at output an electrical signal that is a function of the temperature detected. The signal generated by the temperature sensor 3 is supplied to a processing logic (not illustrated in detail, but, for example, integrated in the ASIC 24 described hereinafter), which, on the basis of said detected value controls heating of the heater 18 (e.g., by supplying current to the heater 18 so that it will generate heat by the Joule effect and interrupting the flow of current when the desired temperature has been reached). The desired temperature value may be stored in a memory (not illustrated in detail, but which, for example, is also integrated in the ASIC 24 described hereinafter).

The second die 20 has a respective front surface 20a, lying in the horizontal plane XY, and a respective rear surface 20b, opposite to the front surface 20a, in the direction Z.

The first die 10 is set on top of the second die 20 in the direction Z, or, in other words, the two dies 10, 20 are stacked along one and the same vertical axis parallel to the direction Z.

In detail, the second die 20 includes a semiconductor body 21 (comprising, for example, a substrate and a plurality of dielectric and conductive layers), provided in which in a known way are a plurality of electronic components (for example, the bias-and-read circuit 22 and the signal generator 9), as well as all the circuitry for reading the signal supplied by the magnetic-field sensing element 2 such as, for example, reading front-ends, ADCs, current-reference and voltage-reference generators, control logic, filters, memories, logic for processing the signal generated by the temperature sensor 3 (for example, the circuitry that forms an ASIC, designated as a whole by the reference number 24).

Irrespective of the embodiment of the heater 18, the latter includes a first conduction terminal 18a and a second conduction terminal 18b, which are electrically coupled to respective conduction terminals 9a, 9b of the signal generator 9 (here, for example, a voltage generator). The signal generator 9 is configured for biasing the heater 18 at a voltage $V_T$ such as to generate a flow of current $i_T$ between the first and second conduction terminals 18a, 18b. Said flow of current $i_T$ generates heating of the heater 18 by the Joule effect. The heat thus produced propagates uniformly through the layers above the layer 17, until it reaches and heats the magnetic-field sensing element 2. It is evident that the value of voltage $V_T$ applied to the heater 18, as likewise the current $i_T$ between the first and second conduction terminals 18a, 18b and the heat generated by the Joule effect, vary according to a plurality of parameters, amongst which the material, dimensions, and geometry of the heater 18. Furthermore, the heat received by the magnetic-field sensing element 2 depends upon the distance (along Z) between the heater 18 and the magnetic-field sensing element 2.

Figure 2:
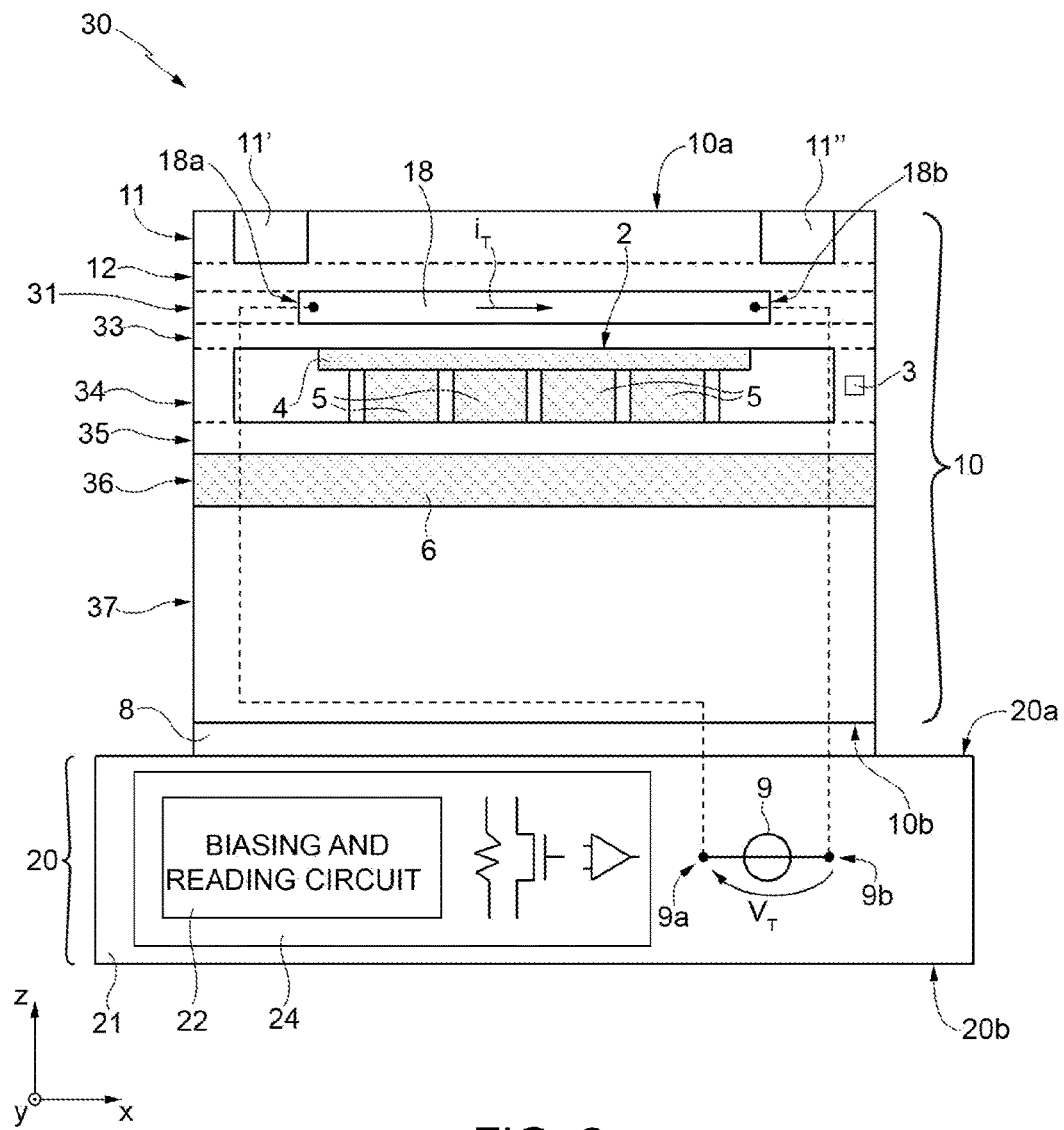

FIG. 2 shows a cross-sectional view of a portion of a magnetic-field sensing device 30 according to an embodiment alternative to that of FIG. 1. The magnetic-field sensing device 30 comprises, in a way similar to what has been described with reference to FIG. 1 (and hence the same reference numbers are used) the first die 10 housing the magnetic-field sensing element 2, and the second die 20 housing the circuit 22 for biasing and reading the magnetic-field sensing element 2.

The first die 10 comprises the layer 11, for interface towards the outside, for example, obtained via a passivation technique. The passivation layer 11 is designed to house conductive connections 11' and 11" (for example, metal conductive pads). Extending underneath the passivation layer 11 is the insulation layer 12. The insulation layer 12 is made of dielectric material (e.g., silicon oxide) and houses a plurality of vias (not illustrated).

According to the embodiment of FIG. 2, extending underneath the insulation layer 12 is a heating layer 31, similar to the heating layer 17 of FIG. 1. The heating layer 31 houses a heater 18, which is of the same type as the heater 18 of FIG. 1 and for this reason is designated by the same reference number.

Extending underneath the layer 31 is an insulation layer 33, designed to insulate the heater 18 electrically from the underlying magnetic-field sensing element 2. In fact, extending underneath the layer 33 is a layer 34 comprising oxides and metals, housing conductive connections (for example, the connections that connect the bias-and-read circuit 22 with conduction terminals of the magnetic-field sensing element 2). In a way similar to what has been described with reference to FIG. 1, also in this case the sensor device is based upon magnetoresistive elements, of an AMR type, and the magnetic-field sensing element 2 is a strip of magnetoresistive material. The aforementioned conductive connections are consequently electrically coupled to respective terminal portions of the strip of magnetoresistive material for biasing it in a way in itself known.

Extending underneath the layer 34 is an insulation layer 35, made of dielectric material, which houses one or more conductive vias (not illustrated in the figure).

Then, extending underneath the insulation layer 35 is a metal layer 36, which houses a magnetic-field generator 6, of the same type as the magnetic-field generator 6 of FIG. 1.

The metal layer 36 may moreover house further connection elements and/or metal paths to form connections between the top layers and the bottom layers.

Underneath the metal layer 36 there may be present further insulation layers, metal layers, and a substrate (designated as a whole by the reference number 37). Present at the bottom surface 10b of the first die 10, in a way similar to FIG. 1, is the coupling layer 8, configured for coupling the first die 10 to the second die 20.

According to the embodiment of FIG. 2, the second die 20 is similar to the second die 20 described with reference to FIG. 1 and consequently it will not be described any further herein.

According to a further embodiment (not illustrated in the figure), the heater 18 is formed in a region of the first die 10 extending between the magnetic-field sensing element 2 and the magnetic-field generator 6, electrically insulated from both.

Figure 3:
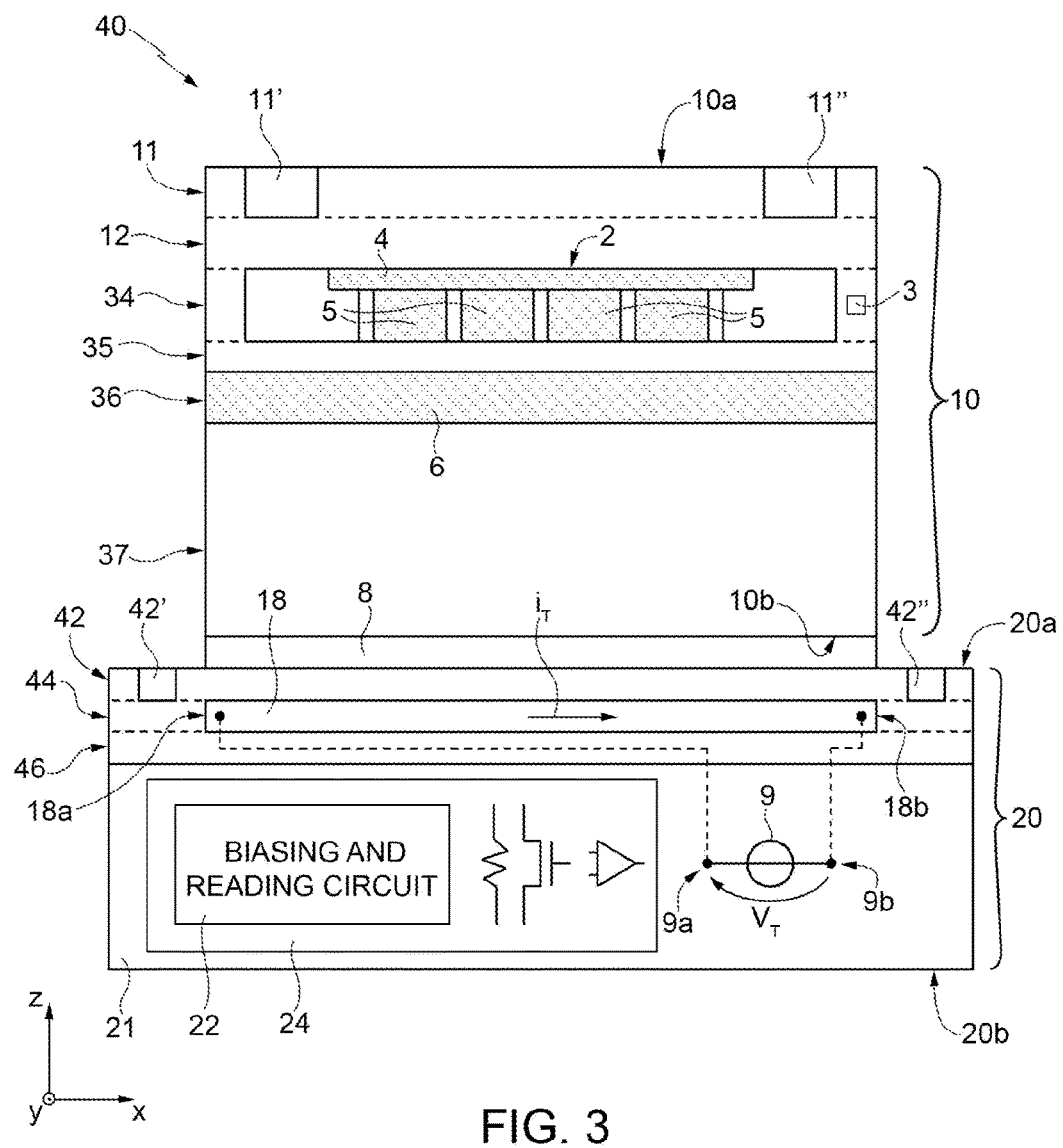

FIG. 3 shows a further embodiment of a sensor device 40, according to one aspect of the present disclosure. Elements that are common to those of FIG. 2 are designated by the same reference numbers.

According to the embodiment of FIG. 3, the heater 18 is formed integrated in the second die 20. In this case, the second die 20 includes a top interface layer 42, made of dielectric or insulating material (for example, a passivation layer), designed to form a coupling interface with the first die 10. The top interface layer 42 houses a plurality of conductive pads 42', 42", designed for being electrically coupled with respective conductive pads of the first die 10, in a way in itself known (for example, by means of wire bonding or solder balls).

Extending underneath the top interface layer 42 is a heating layer 44 that houses the heater 18. The heater 18 has a shape and dimensions according to what has already been described with reference to FIG. 1, and may be formed using any of the methods for manufacture of integrated resistors of a known type (e.g., deposition and definition of conductive material, implantation of doped regions, etc.). Furthermore, the heater 18 is formed in a region of the second die 20 such that, when the first and second dies 10, 20 are coupled together, the magnetic-field sensing element 2 and the heater 18 are, in top plan view, at least partially set on top of one another (i.e., at least partially aligned in the direction Z).

Extending underneath the heating layer 44 is a further insulation layer 46, for insulating the heater 18 from the electrical/electronic elements that form the bias-and-read circuit 22, the ASIC 24, and the signal generator 9. It is evident that between the top interface layer 42 and the heating layer 44 there may extend a plurality of further layers (not shown) of a dielectric or metal type, for example, housing electrical/electronic components. Similar considerations may be made as regards the region of the second die 20 underneath the heating layer 42.

Figure 4:
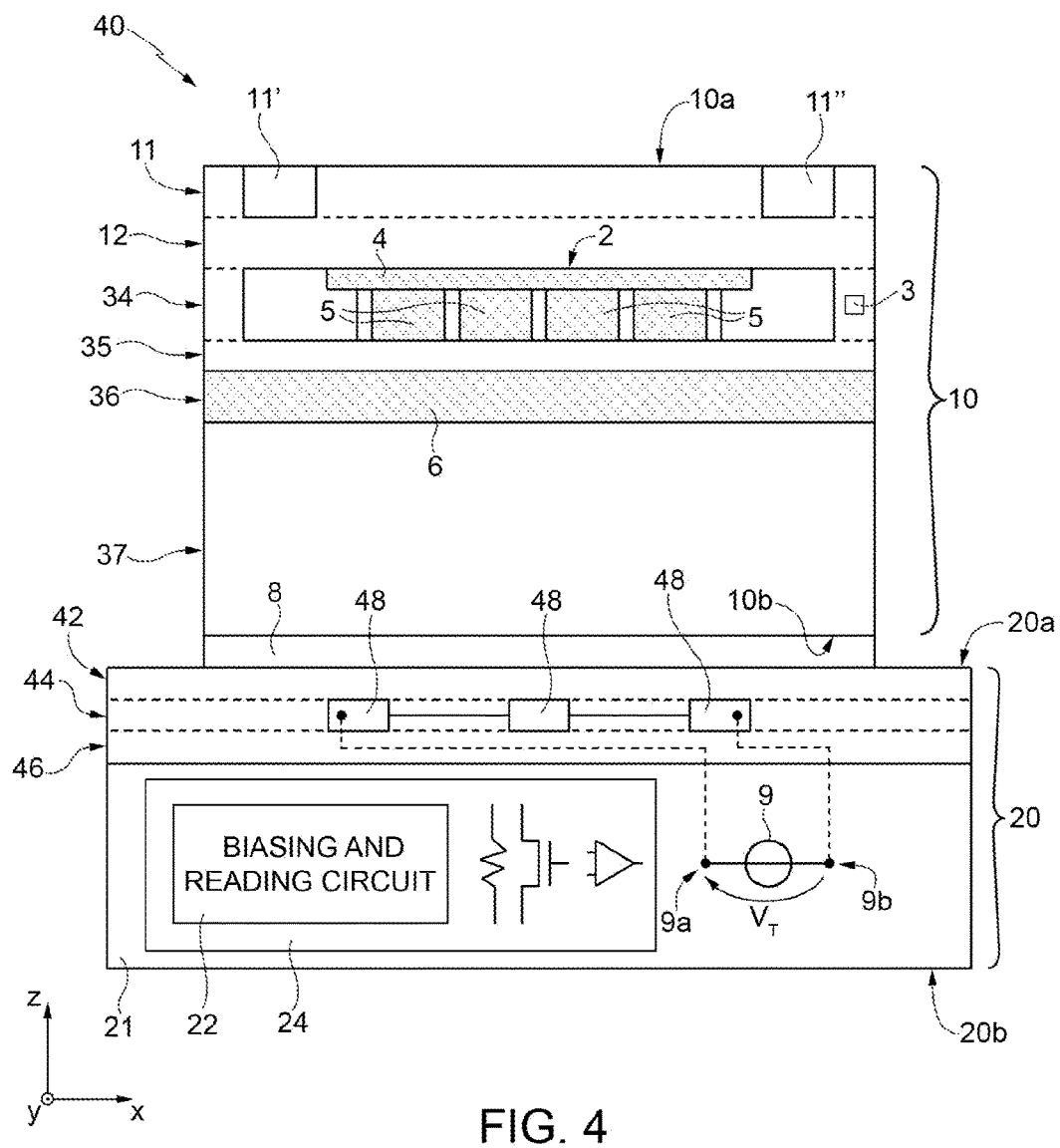

FIG. 4 shows the sensor device 40 according to a further embodiment of the present disclosure. In particular, it is pointed out that the second die 20 presents a high density of integration of electrical and electronic components in so far as it houses a large part (or all) of the circuits that control and govern operation of the sensor device 40. Consequently, integration in the second die 20 of the heater 18 could prove problematical. Furthermore, the temperatures that can be reached by the heater 18 in use could permanently damage electronic components situated in the proximity of the heater 18. For this purpose, according to one aspect of the present disclosure, the heater 18 comprises a plurality of heatable elements 48, configured for generating heat by the Joule effect, connected together in series or in parallel and arranged in regions of the second die 20 without electronic components or other elements that might undergo thermal damage. In FIG. 4, the heatable elements 48 are, by way of example, connected together in series and biased at the voltage $V_T$ by means of the signal generator 9. The heatable elements 48 are, for example, conductive microstrips, or else MOS transistors with low on-state resistance $R_{ON}$, or else alternatively DMOS transistors.

Furthermore, the heatable elements 48 are arranged in respective regions of the second die 20 such that, when the first and second dies 10, 20 are coupled together, the magnetic-field sensing element 2 and the heatable elements 48 are, in top plan view, at least set on top of one another (i.e., aligned in the direction Z). Furthermore, the heatable elements 48 are preferably arranged at equal distances apart to guarantee spatial uniformity of heating.

According to a further embodiment (illustrated in FIG. 5A), the resistor 18 (formed according to any of the embodiments previously described with reference to FIGS. 1-4) is integrated in a substrate of a package 50 that encapsulates the first and second dies 10, 20.

The package 50 is a casing that surrounds, totally or in part, the dies 10, 20 of the sensor device, ensuring protection thereof from external agents and enabling electrical connection thereof towards the external environment. The assembly of the sensor device within the corresponding package 50 is usually defined as a whole as "die", and may, for example, be electrically connected to a printed circuit of an electronic apparatus in which the sensor device itself is to be used.

Typically, the package includes a covering structure, or cap 51, defining at least one cavity 52 inside the package 50 itself. Furthermore, an access opening (not illustrated) is possibly provided through the covering structure 51 in the case where a fluidic connection is supplied outside of the package 50 (for example, for inlet of pressure or acoustic waves). Other types of package may in any case be provided (for example, a package in which the dies are surrounded by a protective resin).

Typically, the packaging technique envisages the use of standard processes of micromachining of the dies also for producing the corresponding package, providing at the wafer level, i.e., before the corresponding operation of singulation, also the structures for covering and protection of the dies themselves and the corresponding electrical and/or fluidic connections towards the outside, thus simplifying the overall manufacturing process and rendering it uniform.

According to the embodiment of FIG. 5, the sensor device (here designated as a whole by the reference number 60) comprises the package 50 housing the dies 10, 20, ensuring protection thereof from the external environment and moreover ensuring the electrical connections between the external environment itself and the ASIC 24 and/or the bias-and-read circuit 22.

In the embodiment illustrated, the package 50 comprises a substrate, or base support, 54, having an internal surface 54a, facing the inside of the package 50 (i.e., the cavity 52), and an outer surface 54b, facing the external environment. In particular, the base support 54 includes a substrate and dielectric and metal layers set on top of one another.

The second die 20 integrating the ASIC 24 is coupled to the internal surface 54a of the base support 54, by means of a respective adhesive layer 56, which is set between the internal surface 54a itself and the rear surface 20b of the second die 20.

Electrical wires 62 electrically connect pads 64 carried by the front surface 20a of the second die 20 to corresponding electrical pads or paths 66 carried by the internal surface 54a of the base support 54.

Furthermore, the base support 54 itself carries, on its outer surface 54b, purposely provided elements 68 for electrical connection towards the external environment (for instance, to a printed-circuit board PCB), in the form, for example, of conductive lands or bumps.

Appropriate electrical-connection vias 69 are provided through the base support 54, for setting in connection the electrical pads or paths 66 carried by the internal surface 54a of the base support 54 itself and the electrical-connection elements 68.

Figure 5A:
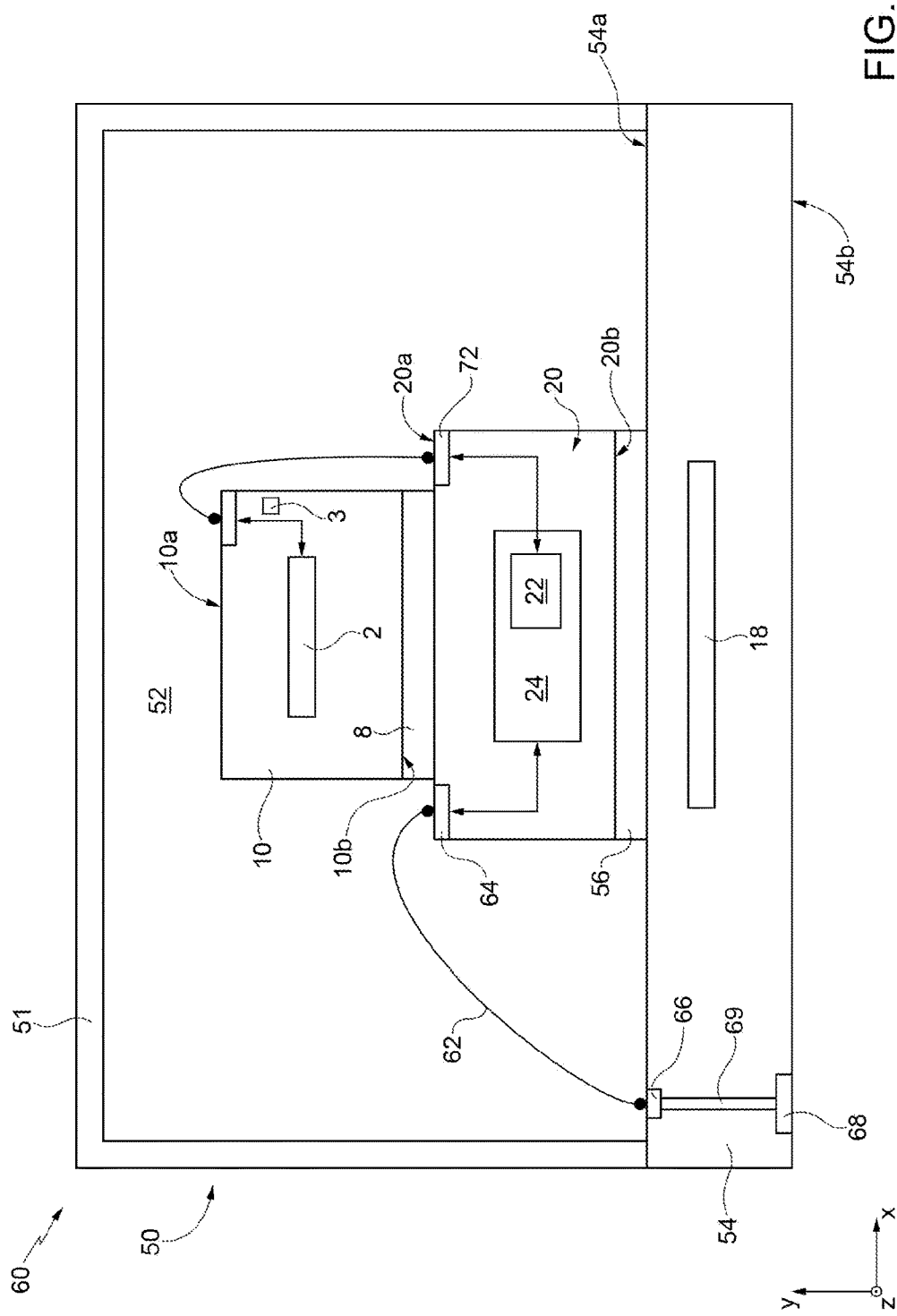

According to the embodiment of FIG. 5A, electrical coupling between the first die 10 and the bias-and-read circuit 22 and/or ASIC 24 in the second die 20 is provided using the wire-bonding technique, i.e., with electrical wires 71 that electrically connect corresponding contact pads 11" and 72 carried by the respective front surface of the two dies 10, 20. Further conductive wires are provided for electrical connection of the signal generator 9 to the heater 18, 48, according to the respective embodiments, as already illustrated previously.

According to the present disclosure, the base support 54 includes layers set on top of one another of insulating material and conductive material. The conductive material is deposited and defined (e.g., lithographically) to form one or more conductive strips designed to provide a heater (similar to the heater described with reference to FIGS. 1-3 and for this reason designated once again by the reference number 18) designed to generate heat by the Joule effect. Alternatively, the heater integrated in the base support 54 may comprise a plurality of heater sub-elements 48 of the type described with reference to FIG. 4.

The signal generator designed to supply a voltage/current signal to the heater 18, 48 may be formed integrally in the second die 20 and may be electrically coupled to the heater 18, 48 through a conductive wire similar to the conductive wire 62. According to a further embodiment, said signal generator may be set outside the sensor device 60, electrically coupled to the heater 18, 48 through respective electrical-connection elements (e.g., conductive pads) that are similar to the electrical-connection element 68, formed on the outer surface 54b of the base support 54.

According to one aspect of the embodiment of FIG. 5A, the heater 18, 48 is, in top plan view (i.e., looking down on the plane XY), at least partially set on top of the magnetic-field sensing element 2, i.e., at least partially aligned, in the direction Z, to the magnetic-field sensing element 2.

According to another aspect of the embodiment of FIG. 5A, the heater is not aligned to the magnetic-field sensing element 2. In this case, in fact, since the cavity 52 of the package 50 is insulated from the outside by means of the cap 51 and the base support 54, heating of any portion of the base support 54 causes a consequent substantially uniform heating of the entire cavity 52.

As has been said, and in a way not illustrated in the figures, further heaters 18 may be provided in one or more from among the first die 10, the second die 20, and the base support 54 of the package 50.

Figure 5B:
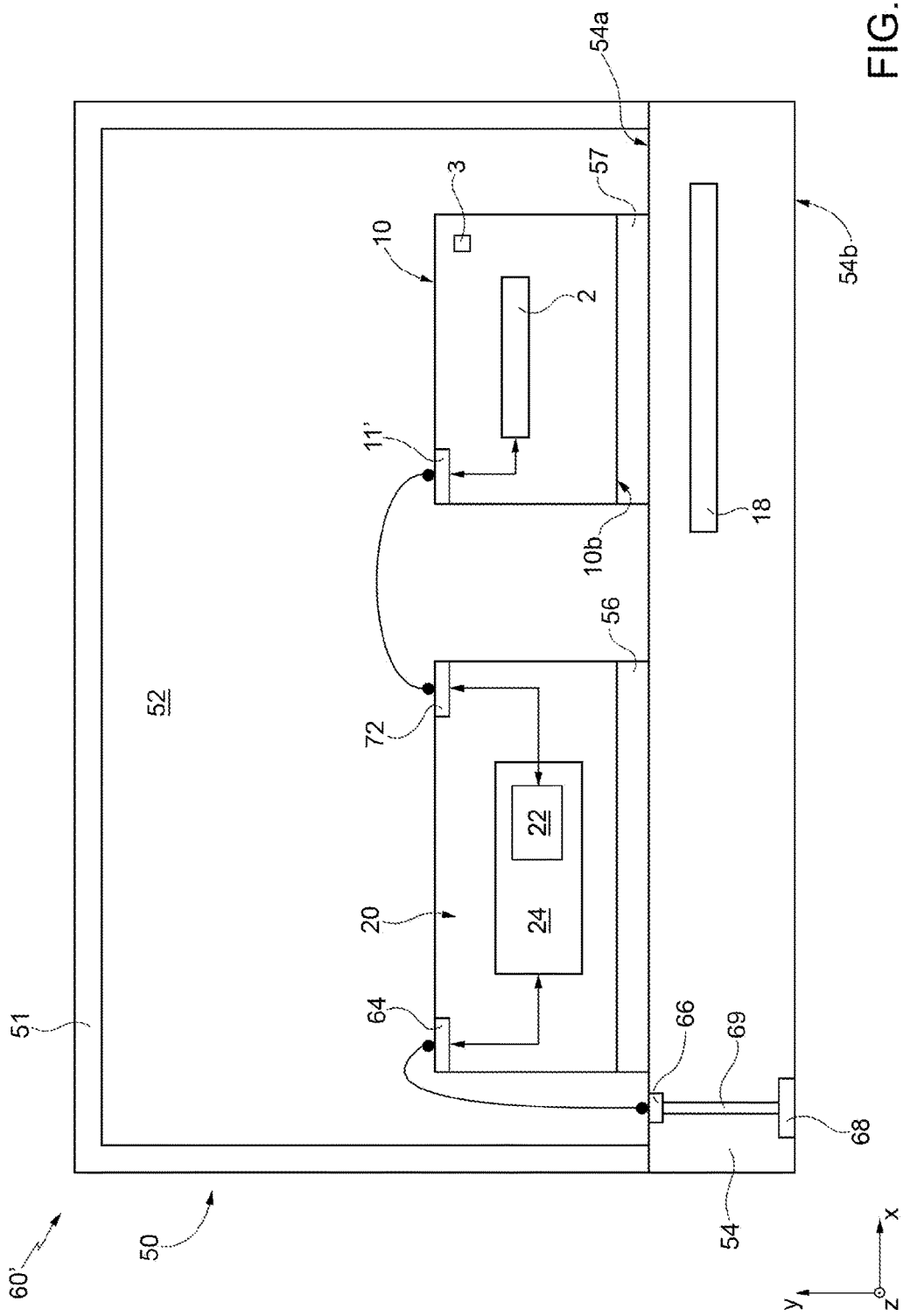

FIG. 5B shows, according to an embodiment alternative to that of FIG. 5A, a sensor device 60' similar to the sensor device 60 of FIG. 5A (elements that are in common are designated by the same reference numbers and are not described any further herein).

Unlike what is illustrated in FIG. 5A, here the first and second dies 10, 20 are not stacked on top of one another, but are arranged alongside one another on the base support 54, in the cavity 52. Hence, according to this embodiment, the first die 10 is mechanically coupled to the base support 54 by means of an adhesive layer 57, which is set between the internal surface 54a itself and the rear surface 10b of the first die 10.

The heater 18 is integrated in the base support 54, in particular at least partially aligned, in the direction Z, with the first die 10, more in particular with the magnetic-field sensing element 2, housed in the first die 10.

It is evident that the heater 18, irrespective of the particular embodiment of the sensor device of FIGS. 1-5B, may have a shape different from the shape of a rectilinear strip.

Figure 6:
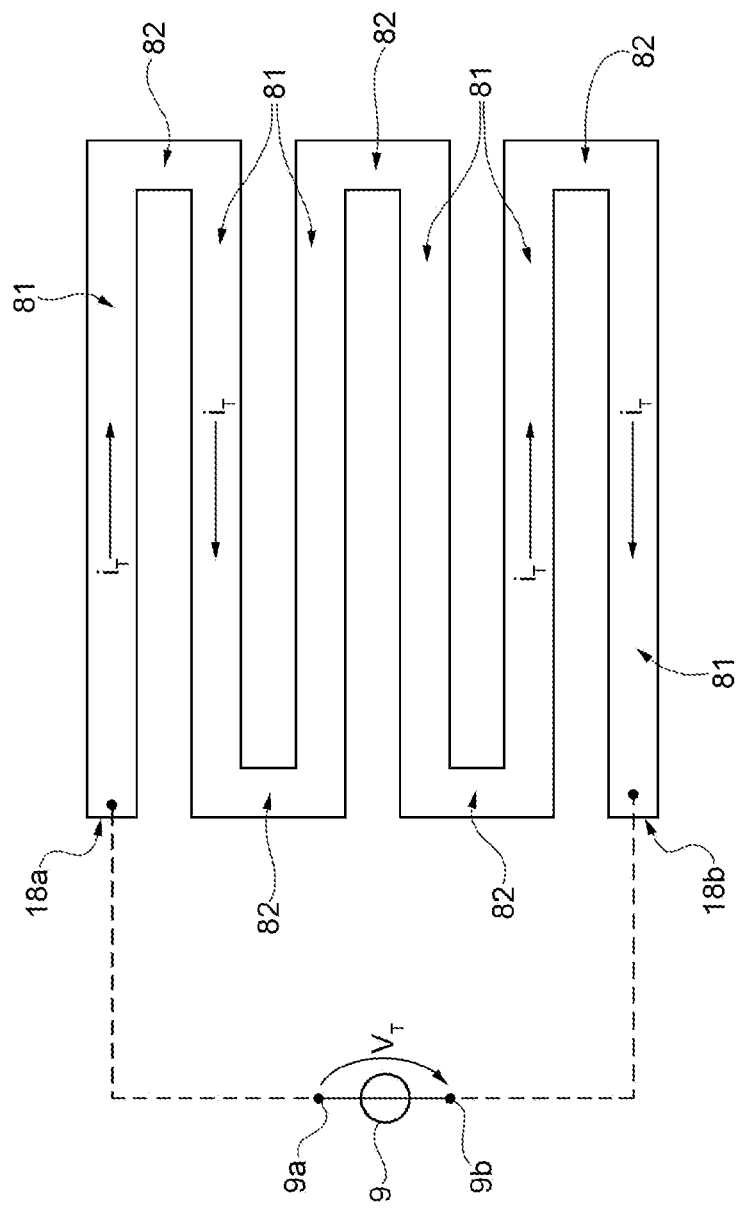
FIG. 6 shows in top plan view an embodiment of the resistive heater of the sensor device according to any one of the embodiments of FIGS. 1-5B.

FIG. 6 shows, in top plan view (i.e., in the plane XY), a heater 18 having a serpentine-like shape, including a plurality of substantially rectilinear and mutually parallel portions 81, having a main extension in the direction X. Mutually facing portions 81 are electrically coupled to one another by means of respective coupling portions 82, having their main extension along the axis Y. When biased to the voltage $V_T$, a current $i_T$ flows through the portions 81, generating heat by the Joule effect. This embodiment of the heater is particularly useful in so far as it is possible to cover (and heat) a relatively large area of the die in which the heater 18 is integrated and of the die/dies coupled thereto.

In addition, this embodiment finds a further particular application in the case where the sensor housed in the first die is a magnetic sensor. In fact, as is known, a conductor traversed by an electric current generates a magnetic field having lines of field orthogonal to the direction of the flow of current $i_T$. In the case of a magnetic sensor, the field thus generated can affect proper operation thereof. However, in the case of FIG. 6, the lines of magnetic field generated in a portion 81 compensate (i.e., cancel out) the lines of magnetic field generated in the adjacent portion 81, thus rendering the magnetic field itself theoretically zero.

In practice, nor does the embodiment of FIG. 6 enable complete elimination of the undesirable magnetic field deriving from the heating step. For this purpose, it is advisable to control the signal generator 9 as described in what follows.

In the step that precedes calibration of the sensor device, the signal generator 9 is controlled for generating one or more current pulses $\delta_i$ through the heater 18, each having a duration and an amplitude such as not to damage the heater 18 (and the electronics if the heater is integrated in the ASIC, or the sensor if the heater is integrated in the sensor die) and bring the temperature of the sensor to the desired value.

Purely by way of example, a possible range of current values for each current pulse $\delta_i$ is comprised between approximately 50 mA and 300 mA, in particular between 100 mA and 250 mA, and the duration of the pulse between 50 ms and 300 ms, in particular between 100 ms and 250 ms. Typically, the values of amplitude and duration of the current pulse are chosen such as to heat the first die 10 to the desired temperature (e.g., between 60° C. and 80° C.).

It is evident that the increase in temperature in the regions that house the heater 18, 48 (in particular, when the latter is housed in the second die 20 or in the substrate 54 of the package 50) is greater than the temperature transferred to the first die 10 and to the magnetic-field sensing element 2. It is consequently expedient to supply the heater 18 with current pulses $\delta_i$ such that the temperature in the regions immediately surrounding the heater 18 will not exceed a critical temperature for the materials of said immediately surrounding regions and/or for possible electronic components situated in the vicinity (typically, the critical temperature is higher than 90° C.).

In a way in itself known to the person skilled in the art, once the resistivity of the heater 18 is known, it is possible to modulate the current supplied to the heater 18 for generating heat by the Joule effect in order to reach the desired temperature. The desired temperature is a predefined value stored in a memory of the ASIC 24. It is evident that it is possible to store a plurality of predefined temperature values for carrying out calibration for a plurality of temperature values. If the memory is rewritable, it is also possible to update said desired temperature value during use or during testing of the sensor device according to the present disclosure. The ASIC 24 comprises a comparator configured for receiving at input the predefined temperature value (stored) and the temperature value detected supplied at output by the temperature sensor 3 and generate a comparison signal indicating the fact that the temperature measured has reached or exceeded the predefined temperature value. On the basis of the comparison signal, the ASIC 24 interrupts biasing of the heater 18 by the signal generator 9, consequently interrupting the flow of current $i_T$, $\delta_i$ through the heater 18. As a result no further heat is generated by the Joule effect.

As has been said, the temperature sensor is preferably housed in the first die 10 so that the temperature measured is effectively the temperature "perceived" by the magnetic-field sensing element 2.

Next, once the desired temperature is reached, the signal generated at output by the sensor is measured (the signal at output from the sensor is a signal that is a function of a quantity measured by the sensor, e.g., the value of a magnetic field). Typically, temperature calibration is carried out in the absence of the external quantity for being measured so that the signal at output from the sensor is, in effect, the offset that afflicts the sensor itself on account of the increase in temperature. For this purpose, the integrated device according to the present disclosure further comprises a calibration circuit (e.g., integrated in the ASIC 24) configured for acquiring the signal at output from the sensor 2 when the sensor 2 has reached the predefined temperature and obtaining the offset value that afflicts the signal at output from the sensor 2 when the sensor 2 has reached the predefined or desired temperature.

This measuring step is hence carried out at the end of the current pulse $\delta_i$ (consequently when the corresponding magnetic field generated has decayed to negligible values), but at an instant in time when the first die 10 is still at the desired temperature (or at a temperature very close to the desired temperature). In fact, the time of cooling of the heater 18 and of the first die 10 is by many orders of magnitude longer than the time useful to carry out the measurement of the magnetic field driven during calibration. The present applicant has found that the magnetic field produced by the heater is cancelled practically instantaneously after quenching of the biasing circuit of the heater, which in any case has a certain quenching transient.

By carrying out the measurement in temperature of the signal at output from the sensor in a resting condition of the sensor itself (i.e., when the quantity for being measured is zero), it is possible to obtain the offset generated by the controlled increase in temperature, and thus proceed to its calibration. By knowing the offset value as the temperature varies it is possible to compensate for the drifts that the output signal undergoes as the temperature varies in use (basically by subtracting the offset value from the measurement supplied by the sensor).

It is moreover to be noted that, in the particular case of an AMR sensor of the type described, for example, in the patent and publication Nos. U.S. Pat. No. 5,247,278 and US 2012/0161756, it is possible to use one and the same coil for calibration of the offset (known as offset coil or self-test coil) to carry out the operations of heating of the magnetic-field sensing element (i.e., the ferromagnetic element having a barber-pole structure). In this case, an additional heater is not necessary, and the steps of heating, prior to calibration, may be carried out by generating the current pulse $\delta_i$ directly through the offset-calibration coil already present on the sensor itself.

With reference to sensors of an inertial type (e.g., accelerometers and gyroscopes), also these present an output signal, the value of which depends upon the temperature at which the inertial sensor operates. This is due to a plurality of factors, amongst which: stress deriving from the manufacturing process ("built-in stress") and from coupling of the die housing the sensor with the package; variations of the quality factor; and variations of the properties of the materials used.

The built-in stress varies as the temperature at which the sensor operates varies on account of the different coefficients of thermal expansion of the materials used for manufacturing the sensor and the package. In the majority of cases, inertial sensors are packaged hermetically at the wafer level or at the package level. This hermetic packaging is in a cavity inside the sealed package, where the pressure and gaseous composition can be regulated to enable correct operativeness of the sensor device. In particular, in the case of resonant gyroscopes and sensors, a very low pressure inside the package is essential to obtain a quality factor of a high value. Since the sensor is sealed inside the package, an increase in temperature inside the package entails an increase of the internal pressure. If the cavity inside the package has a low level of vacuum, the damping effect is dominated by the damping caused by the gas (e.g., air)

present in the cavity of the package. A heater can effectively be used to bring the temperature inside the package to the optimal operating value of the inertial sensor, as well as to verify operativeness of the inertial sensor at different temperatures, in the testing step.

In this way, it is possible to investigate the effective behavior of the inertial sensor, at the end of the manufacturing steps, at different operating temperatures, in a fast and inexpensive way.

What has been described with reference to FIGS. 1-6 likewise applies, as will be evident to the person skilled in the art, to inertial sensors. In this case, the first die 10 does not house the magnetic-field sensing element 2, but houses the sensitive structure of the inertial sensor (a micromechanical sensing structure designed to come into contact with the external environment to enable detection of the environmental quantities of interest, and including, for example, masses mobile in one or more directions). The bias-and-read circuit 22 of the second die 20 is in this case configured for governing a controlled movement (e.g., in resonance) of the mobile masses of the inertial sensor and for receiving an output signal that is a function of a force applied to the mobile masses of the inertial sensor, according to the known operation of inertial sensors.

The heater 18 may be housed in one or more from among the first die 10, the second die 20, and the base support 54 of the package 50.

The advantages of the disclosure emerge clearly from the foregoing description.

In particular, these advantages include simplicity of production and complete integration in the standard manufacturing flow of integrated devices and increase in the rapidity of the testing steps, with consequent advantages in economic terms.

Finally, it is clear that modifications and variations may be made to what has been described and illustrated herein, without thereby departing from the sphere of protection of the present disclosure, as defined in the annexed claims.

For example, the first die 10 may house (as an alternative to the magnetic-field sensing element 2 described with reference to FIGS. 1-5B) a generic sensor element, in particular a sensor element provided in MEMS technology, different from the inertial sensor and from the magnetic-field sensor, for example, a pressure sensor, a microphone, a speaker, or a generic MEMS transducer.

Furthermore, for any of the embodiments described previously, the temperature sensor 3 may be integrated, instead of in the first die 10, in the second die 20, or in the base support 54 of the package 50.

Furthermore, the signal generator 9 may be integrated in the first die 10 or else in the base support 54 of the package 50.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated sensor device, comprising:
    a first die including a sensor element configured to detect a quantity external to the sensor device and transduce said external quantity into an electrical sensing signal;
    a second die mechanically coupled to the first die, the first and second dies stacked on one another along a first axis;
    a resistive heater, having a first conduction terminal and a second conduction terminal;
    a temperature sensor configured to sense a temperature of the sensor element;
    a signal generator having a first conduction terminal and a second conduction terminal electrically coupled to the first and second conduction terminals of the resistive heater, respectively, and configured to provide an electric current between the first and second conduction terminals of the resistive heater to generate heat by the Joule effect to bring the sensor element to a threshold temperature; and
    a calibration circuit configured to receive the sensed temperature of the sensor element from the temperature sensor, acquire said electrical sensing signal when the sensed temperature of the sensor element has reached said threshold temperature, and to obtain an offset value that biases the electrical sensing signal when the sensed temperature of the sensor element has reached said threshold temperature.

2. The integrated sensor device of claim 1 wherein the resistive heater is integrated in the first die.

3. The integrated sensor device of claim 1 wherein the resistive heater is integrated in the second die.

4. The integrated sensor device according to claim 1 wherein the resistive heater includes a plurality of heater sub-elements electrically coupled together by electrical-connection sub-regions.

5. The integrated sensor device according to claim 4 wherein the resistive heater has a serpentine-like shape in which said plurality of heater sub-elements extend to form mutually parallel conductive strips, and said electrical-connection sub-regions extend orthogonal to the heater sub-elements electrically coupling in series together two adjacent heater sub-elements.

6. The integrated sensor device according to claim 1 wherein the heater extends in a region of the first die that is substantially aligned, along the first axis, to the sensor element.

7. The integrated sensor device according to claim 1 wherein the heater extends in a region of the first die without electrical components.

8. The integrated sensor device according to claim 1 wherein the heater includes at least one from among: a strip of conductive material, a region implanted with dopant species, and a transistor.

9. The integrated sensor device according to claim 1 wherein said signal generator is integrated in the first die.

10. The integrated sensor device according to claim 1 wherein the signal generator is configured to supply said electric current in the form of current pulses.

11. The integrated sensor device according to claim 1 wherein the second die houses an integrated circuit operatively coupled to the sensor element and configured to acquire said electrical sensing signal.

12. The integrated sensor device according to claim 1, further comprising a third die that forms a base support of a package adapted to house, in an internal cavity, said first and second dies.

13. The integrated sensor device according to claim 1, further comprising a third die housing an integrated circuit operatively coupled to the sensor element of the first die and configured to acquire said electrical sensing signal, and wherein said second die is a base support of a package, said package having an internal cavity to house said first and third die.

14. A method, comprising:
calibrating an integrated sensor device that includes a first die coupled to a second die, the first die includes a sensor element configured to detect a quantity external to the sensor device and transduce said external quantity into an electrical sensing signal, the integrated sensor device includes a resistive heater, the calibrating including:
generating a flow of electric current between first and second conduction terminals of the heater with a signal generator for generating heat by the Joule effect;
measuring a temperature value by a temperature sensor embedded in the integrated sensor device;
receiving, by a calibration circuit, the measured temperature value from the temperature sensor;
acquiring, by the calibration circuit, the electrical sensing signal when the measured temperature value has reached a threshold temperature value; and
calibrating the sensor element based on the acquired electrical sensing signal.

15. The method according to claim 14 wherein calibrating the sensor element includes obtaining an offset value that afflicts the electrical sensing signal generated by the sensor element when the temperature value has reached the threshold temperature value.

16. The method according to claim 14 wherein generating a flow of electric current includes generating one or more pulses of electric current having a temporal duration between approximately 50 ms and 300 ms and an amplitude between approximately 50 mA and 300 mA.

17. A device, comprising:
a resistive heater element;
a first die that includes:
  a sensor element; and
  a temperature sensor configured to sense a temperature of the sensor element; and
a second die stacked on the first die, the second die includes:
  a signal generator coupled to the resistive heater element, the signal generator being configured to heat the resistive heater element to a selected temperature for calibration of the device; and
  a calibration circuit coupled to the sensor element, the calibration circuit being configured to receive the sensed temperature of the sensor element from the temperature sensor, acquire a sensing signal from the sensor element when the sensed temperature has reached a threshold temperature, and calibrate the sensor element based on the acquired sensing signal.

18. The device of claim 17 wherein the resistive heater is in the first die and is positioned between the sensor element and the signal generator of the second die.

19. The device of claim 17 wherein the heater element is in the first die and the sensor element is positioned between the heater element and the signal generator of the second die.

20. The device of claim 17 wherein the sensor element includes a ferromagnetic layer and a layer that includes copper portions.

21. The device of claim 17, further comprising a support substrate, the resistive heater element being positioned in the support substrate, the first and second die being positioned on the support substrate.

* * * * *